(12) United States Patent
Nielsen

(10) Patent No.: US 9,319,789 B1
(45) Date of Patent: Apr. 19, 2016

(54) BASS ENHANCEMENT

(75) Inventor: Soren Henningsen Nielsen, Lystrup (DK)

(73) Assignee: TC GROUP A/S (DK)

( * ) Notice: Subject to any disclaimer, the term of this patent is extended or adjusted under 35 U.S.C. 154(b) by 1080 days.

(21) Appl. No.: 12/463,898

(22) Filed: May 11, 2009

Related U.S. Application Data

(63) Continuation of application No. 12/393,449, filed on Feb. 26, 2009, now abandoned.

(60) Provisional application No. 61/031,666, filed on Feb. 26, 2008.

(51) Int. Cl.
| | | |
|---|---|---|
| *H03G 5/00* | (2006.01) | |
| *H04R 3/04* | (2006.01) | |
| *H03G 5/02* | (2006.01) | |
| *H03G 5/16* | (2006.01) | |

(52) U.S. Cl.
CPC .................. *H04R 3/04* (2013.01); *H03G 5/025* (2013.01); *H03G 5/165* (2013.01)

(58) Field of Classification Search
CPC ........... H04R 3/04; H03G 5/165; H03G 5/025
USPC .............................................. 381/98, 61, 103
See application file for complete search history.

(56) References Cited

U.S. PATENT DOCUMENTS

| | | | |
|---|---|---|---|
| 5,481,617 A | 1/1996 | Bjerre | |
| 5,930,373 A | 7/1999 | Shashoua et al. | |
| 6,134,330 A * | 10/2000 | De Poortere et al. | 381/61 |
| 6,285,767 B1 | 9/2001 | Klayman | |
| 6,665,408 B1 * | 12/2003 | Schott | 381/98 |
| 7,466,830 B2 * | 12/2008 | Miyashita | 381/103 |
| 8,005,233 B2 * | 8/2011 | Smith | 381/61 |
| 8,045,731 B2 * | 10/2011 | Aoki et al. | 381/102 |
| 8,150,067 B2 * | 4/2012 | Ohkuri et al. | 381/98 |
| 8,290,180 B2 * | 10/2012 | Yamada et al. | 381/98 |
| 2001/0036285 A1 * | 11/2001 | Aarts et al. | 381/100 |
| 2002/0048378 A1 * | 4/2002 | Oki | 381/98 |
| 2003/0086577 A1 * | 5/2003 | Lee | 381/97 |
| 2004/0022400 A1 * | 2/2004 | Magrath | 381/106 |
| 2005/0058303 A1 * | 3/2005 | Martin et al. | 381/98 |
| 2005/0094828 A1 * | 5/2005 | Sugimoto | 381/98 |
| 2005/0185802 A1 * | 8/2005 | Yoshida | 381/98 |
| 2006/0147046 A1 * | 7/2006 | Kasargod et al. | 381/1 |

(Continued)

FOREIGN PATENT DOCUMENTS

GB 2 391 439 2/2004

*Primary Examiner* — Xu Mei
(74) *Attorney, Agent, or Firm* — Cantor Colburn LLP

(57) ABSTRACT

The present invention relates to a bass enhancement system comprising a bass substitution filter with variable gain and variable band width, wherein said variable gain and variable bandwidth at least partly depends on characteristics of an input signal.

Figure 1:
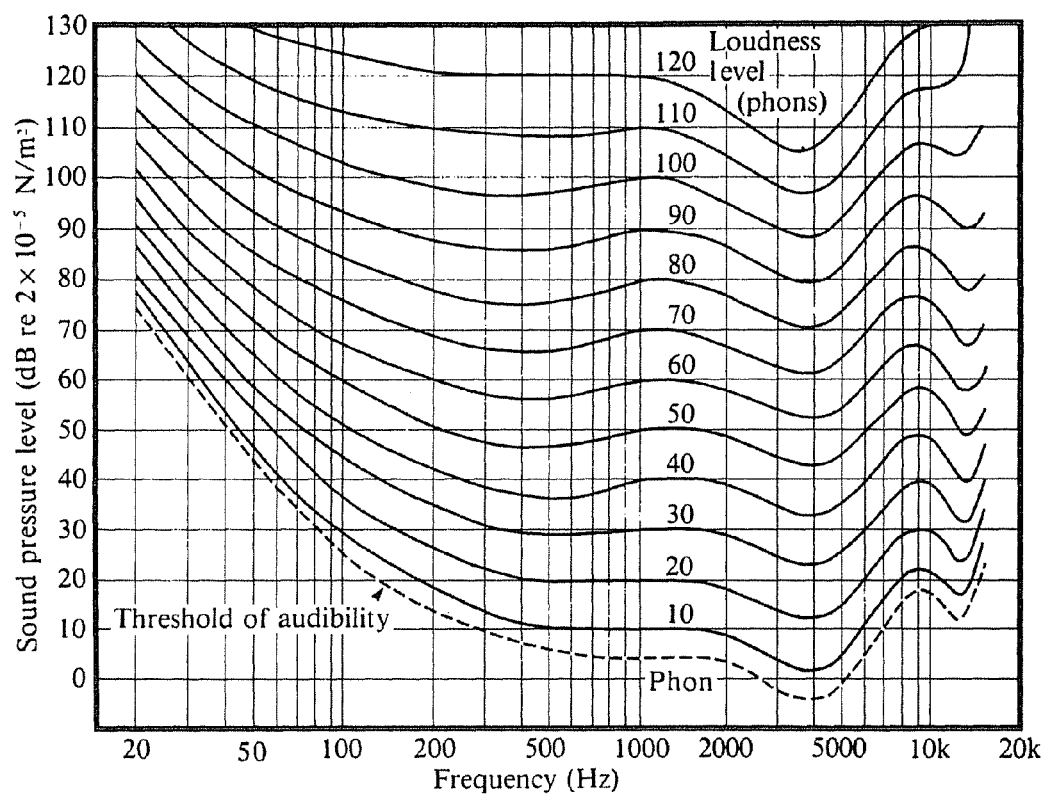

The present invention further relates to a bass enhancement system according to the above, further comprising a hearing compensation filter and a loudspeaker bass response compensation filter, wherein said input signal is coupled to said hearing compensation filter, the output of which is coupled to said loudspeaker bass response filter, the output of which is coupled to said bass substitution filter.

The present invention further relates to a method of enhancing bass perception comprising boosting a reproducible bass frequency band in accordance with characteristics of signal content in a substantially non-reproducible bass frequency band.

12 Claims, 6 Drawing Sheets

(56) References Cited

U.S. PATENT DOCUMENTS

| | | | |
|---|---|---|---|
| 2006/0159283 A1* | 7/2006 | Mathew et al. | 381/98 |
| 2007/0003075 A1* | 1/2007 | Cooper et al. | 381/98 |
| 2007/0253576 A1* | 11/2007 | Bai et al. | 381/98 |
| 2008/0175409 A1* | 7/2008 | Lee et al. | 381/98 |
| 2008/0273718 A1* | 11/2008 | Ohkuri et al. | 381/98 |
| 2008/0292114 A1* | 11/2008 | Shimura et al. | 381/103 |
| 2009/0080675 A1* | 3/2009 | Smirnov et al. | 381/98 |
| 2010/0158272 A1* | 6/2010 | Vickers | 381/98 |

\* cited by examiner

BASS ENHANCEMENT

CROSS-REFERENCE TO RELATED APPLICATION

This application is a continuation of U.S. patent application Ser. No. 12/393,449 filed 26 Feb. 2009 which is related to and claims the benefit of U.S. Provisional Patent Application Ser. No. 61/031,666 filed on 26 Feb. 2008. The contents of both of said applications are herein incorporated by reference in their entirety.

FIELD OF THE INVENTION

The present invention relates to audio reproduction systems.

BACKGROUND OF THE INVENTION

Reproduction at consumers of broadband sounds like music, and broadcast radio and TV, can be done in very high quality using modern storage or transmission media and the appropriate playback equipment, including a proper loudspeaker setup and a suitable, quiet, listening room. In practice, these conditions are not always fulfilled, either due to limitations in the equipment or due to external disturbing or limiting factors. The present invention addresses some of the problems and challenges of sound reproduction in general, but especially those concerning reproduction through small devices with small loudspeakers.

Sound reproduction devices with small loudspeakers and possibly small physical dimensions often suffer from a reduced sound quality compared to a traditional Hi-Fi system. There are several reasons for this, as explained in the following.

First of all, a definition of "small devices" is appropriate. Some examples:
  Mobile telephone size: Very small indeed, both in stereo base and loudspeaker size. These devices are typically battery-powered.
  Portable CD-radio, iPod speaker systems: Small, both in stereo base and loudspeaker size. These devices are typically powered from the mains.
  Flat panel TV, 20-40" diagonal: Medium-sized and with a stereo base smaller than normal Hi-Fi system and with small space for loudspeakers. These devices are typically mains-powered.

According to this definition, the present invention addresses primarily sound reproduction through loud-speakers in small and medium-sized devices.

The term "sound quality" consists of several factors, some of which are treated here. Among the factors influencing the sound quality are:
  Properties of the signal itself
  Transmission and storage media.
  Physical/acoustical factors.
  External factors. For example, playback conditions may be less than optimal: During transportation, in the kitchen, at night time with soft listening level, etc.
  Perceptual factors.

The present invention focuses on the following aspects of the reproduction:
  Bass
  Tonal balance at all levels
  To a lesser degree also the following aspects are treated:
  Dynamic range
  Loudness uniformity Various methods to improve the reproduction of bass from small loudspeakers exist. Some earlier methods to improve the bass reproduction from small loudspeakers by employing variable filters include the U.S. Pat. No. 5,481,617 (Bjerre, of Bang and Olufsen A/S) and the US patent application US 2004/0022400 (Magrath).

The method described by Bjerre includes a variable band-pass filter and a compensating differentiator. The band-pass filter is controlled by a feedback loop connected to the output of the band-pass filter. From a signal-to-noise ratio point of view this structure is less ideal, a fact which has also been pointed out and remedied by the inventor by means of adding complexity in form of a frequency dividing network to the system. Furthermore, the use of a feedback loop for control inherently increases the risk of overload due to overshoot in the control loop. Finally, the system does not compensate for the lack of bass impression at high levels where the compensation filter is effectively inactive.

The method described by Magrath includes a fixed low-pass filter, of typically second order, together with a very simple compressor, and addition of the low-pass filtered signal to the input signal. The resulting overall frequency response of the system consists of 1) a low frequency range with essentially flat response, corresponding to the pass-band (pole pair frequency) of the low-pass filter, 2) a transition band of a width depending of the amount of gain applied in the compressor, and 3) a high frequency range with essentially flat frequency response. Effectively, the system response comprises a fixed pole pair frequency and a variable zero pair frequency. This type of frequency response is not well suited to mirror the frequency response of the typical loudspeaker, which has one or two pole pairs at essentially fixed frequency and Q-value.

In order to be able to create an impression of low-pitched bass signals without having to reproduce the actual low-frequency components, methods which rely on the principle of virtual pitch have been developed. Two of these methods are described in the U.S. Pat. No. 5,930,373 (Shashoua et al., of K. S. Waves Ltd.) and U.S. Pat. No. 6,134,330 (De Poortere et al., of Philips). Both methods generate harmonic distortion components from the lowest input frequencies by means of a non-linear transfer function. These harmonic components carry the information of the low pitch even if the fundamental frequency component cannot be reproduced by the loudspeaker. A disadvantage of using just the harmonic components to create the impression of a low pitch is that the perceived timbre is changed from that of the original signal. A disadvantage of using a non-linear transfer function is that not only harmonic components are generated but also intermodulation distortion, which is undesirable.

Another method, which also relies on the principle of virtual pitch, is described in U.S. Pat. No. 6,285,767 (Klayman, of SRS Labs, Inc.). One aspect of U.S. Pat. No. 6,285,767 comprises of a level-dependent boost of a fixed frequency range. The frequency range is set by one or more band-pass filters in parallel. The purpose of the band-pass filters is to increase the gain of low frequency harmonic components already present in the signal. Although the harmonic components do carry the information of low pitch, the timbre is undesirably changed compared to the input signal, especially when emphasizing a fixed frequency range.

It is an object of the present invention to overcome the shortcomings and disadvantages of the methods and systems described in e.g. U.S. Pat. No. 5,481,617, U.S. Pat. No. 5,930,373, U.S. Pat. No. 6,134,330, U.S. Pat. No. 6,285,767, and/or US 2004/0022400.

SUMMARY OF THE INVENTION

The present invention relates to a bass enhancement system comprising
- an input arranged to receive an input signal,
- a level detector arranged to detect low frequency parts of said input signal, and
- a bass substitution filter with variable gain and variable centre frequency arranged to gain frequencies corresponding to low order harmonic components of said low frequency parts of said input signal,
- wherein said bass substitution filter is arranged to control said variable gain and variable centre frequency at least partly on the basis of a level of said low frequency parts of said input signal.

The advantage of using a substitution filter with variable centre frequency is that the timbre of the output signal is perceived as more natural than if a fixed frequency range is used. The centre frequency of the substitution filter should move upwards as the low frequency input level rises, and the loudspeaker compensation filter decreases its low frequency gain.

The invention relates to a bass enhancement system comprising a bass substitution filter with variable gain and variable centre frequency, wherein said variable gain and variable centre frequency at least partly depends on characteristics of an input signal.

When the bass enhancement system comprises
- a loudspeaker bass response compensation filter with variable gain at low frequencies,
- wherein said loudspeaker bass response compensation filter is arranged to essentially compensate for a reduced output of a loudspeaker at low bass frequencies, and
- wherein said loudspeaker bass response compensation filter is arranged to control said variable gain at least partly on the basis of a level of said low frequency parts of said input signal, an advantageous embodiment of the present invention is obtained.

At low levels the loudspeaker compensation filter can correct the bass response of the loudspeaker down to quite low frequencies, whereas at higher levels it is not allowable to apply a strong low frequency gain.

When the bass enhancement system comprises
- an ear compensation filter with variable gain at low frequencies,
- wherein said ear compensation filter is arranged to essentially compensate for a reduced hearing sensitivity of low frequencies at low playback levels, and
- wherein said ear compensation filter is arranged to control said variable gain at least partly on the basis of a level of said input signal, an advantageous embodiment of the present invention is obtained.

At low playback levels the ear compensation filter can correct the frequency response of the reproduction system to create a more natural timbre, corresponding to the reproduction at higher levels. At higher playback levels the ear compensation filter should not apply low frequency gain.

In a preferred embodiment, the bass enhancement system comprises both a hearing compensation filter and a loudspeaker bass response compensation filter in addition to the bass substitution filter, and the input signal may be coupled to said hearing compensation filter, the output of which may be coupled to said loudspeaker bass response filter, the output of which may be coupled to said bass substitution filter.

According to the present invention an advantageous bass enhancement system is provided which addresses problems, in particular bass reproduction problems, of all main audio reproduction components, i.e. the human hearing system, the non-ideal loudspeaker and the power stage. It is noted that any other combination of the filters and combination with other filters is within the scope of the present invention.

When the bass enhancement system comprises a user gain control at said input, an advantageous embodiment of the present invention is obtained.

In an embodiment of the present invention there is a user gain control at the input which causes the system gain to be under control which means that dynamic properties are adapted to both the signal and the physical constraints of the system.

When said bass substitution filter is arranged to control said variable gain and variable centre frequency at least partly on the basis of a setting of a user gain control and a level of said low frequency parts of said input signal, an advantageous embodiment of the present invention is obtained.

When said loudspeaker bass response compensation filter is arranged to control said variable gain at least partly on the basis of a setting of a user gain control and a level of said low frequency parts of said input signal, an advantageous embodiment of the present invention is obtained.

When said ear compensation filter is arranged to control said variable gain at least partly on the basis of a setting of a user gain control and a level of said input signal, an advantageous embodiment of the present invention is obtained.

The variable gain, centre frequency or band width of the filters in the bass enhancement system should depend not only of the low frequency content of the input signal but also on the intended playback level. In that way is it ensured that the ear compensation filter and loudspeaker compensating filter can be fully engaged at low playback levels, and the resulting perceived timbre is as natural as possible. At high playback levels, where the loudspeaker compensation filter is not allowed to apply a strong low frequency gain, the loudspeaker compensation filter does not gain the low frequencies. As a substitution for the missing level of the low-pitched signals, gain in the frequency range of low order harmonics of the low-pitched signals is applied by the substitution filter.

When said loudspeaker bass response compensation filter is arranged to control said variable gain at least partly on the basis of a compressor side chain so that said gain decreases at higher input levels, an advantageous embodiment of the present invention is obtained.

When said loudspeaker bass response compensation filter is arranged to control said variable gain at least partly on the basis of a user gain control being arranged to control an amount of compression applied by said compressor side chain such that more compression is applied when said user gain control is set to "louder" or equivalent, an advantageous embodiment of the present invention is obtained.

It is noted that any setting concept of the user gain control is within the scope of the present invention. The term "louder" is intended to refer to any setting or action related to the user gain control which to the user is perceived as increasing the volume, loudness, value, gain or the like, i.e. the opposite of "quieter" or a decrease of volume, loudness, etc.

When said loudspeaker bass response compensation filter is arranged to vary pole frequencies of said loudspeaker bass response compensation filter in order to provide said variable gain at low frequencies, an advantageous embodiment of the present invention is obtained.

When said loudspeaker bass response compensation filter comprises a second order loudspeaker compensation filter, and is arranged to mirror a zero pair of said second order loudspeaker compensation filter with a pole pair of a response of a loudspeaker and control a pole pair of said second order loudspeaker compensation filter in order to control a low frequency gain of said second order loudspeaker compensation filter, an advantageous embodiment of the present invention is obtained.

By using a fixed zero pair of the loudspeaker compensation to mirror the pole pair of the loudspeaker and varying the frequency of the pole pair of the loudspeaker compensation filter, the resulting frequency response is made flat in the region of the pole pair of the loudspeaker. The effective lower corner frequency of the combination of loudspeaker and loudspeaker compensation filter is controlled by the varying pole pair frequency of the loudspeaker compensation filter. The zero pair of the loudspeaker compensation filter should have essentially the same resonance frequency and Q value as the loudspeaker.

When said bass substitution filter is arranged to control said variable gain at least partly on the basis of an expander side chain so that said variable gain increases at higher input levels, an advantageous embodiment of the present invention is obtained.

When said bass substitution filter is arranged to control at least one frequency corner of said bass substitution filter at least partly on the basis of a level of said low frequency parts of said input signal, an advantageous embodiment of the present invention is obtained.

When said bass enhancement system is arranged to process a plurality of audio channels by using appropriate matrices at the input and output, an advantageous embodiment of the present invention is obtained.

In an embodiment of the present invention several audio channels can be processed using basically a single channel by using appropriate matrices at the input and output, thereby exploiting the low importance of exact spatial reproduction of low frequencies.

When the bass enhancement system comprises a measurement means arranged to measure or calculate a loudspeaker frequency response of a loudspeaker, an advantageous embodiment of the present invention is obtained.

When the bass enhancement system comprises a measurement means arranged to measure or calculate a performance of an output amplifier driving a loudspeaker, an advantageous embodiment of the present invention is obtained.

The present invention further relates to a bass enhancement system comprising an input arranged to receive an input signal, a level detector arranged to detect low frequency parts of an input signal, and a bass substitution filter with variable gain and variable band width arranged to gain frequencies corresponding to low order harmonic components of said low frequency parts of said input signal, wherein said bass substitution filter is arranged to control said variable gain and variable band width at least partly on the basis of a level of said low frequency parts of said input signal.

The advantage of using a substitution filter with variable band width is that the timbre of the output signal is perceived as more natural than if a fixed frequency range is used.

The present invention further relates to a method of enhancing bass perception comprising boosting a reproducible bass frequency band in accordance with characteristics of signal content in a substantially non-reproducible bass frequency band.

THE DRAWINGS

Figure 2:
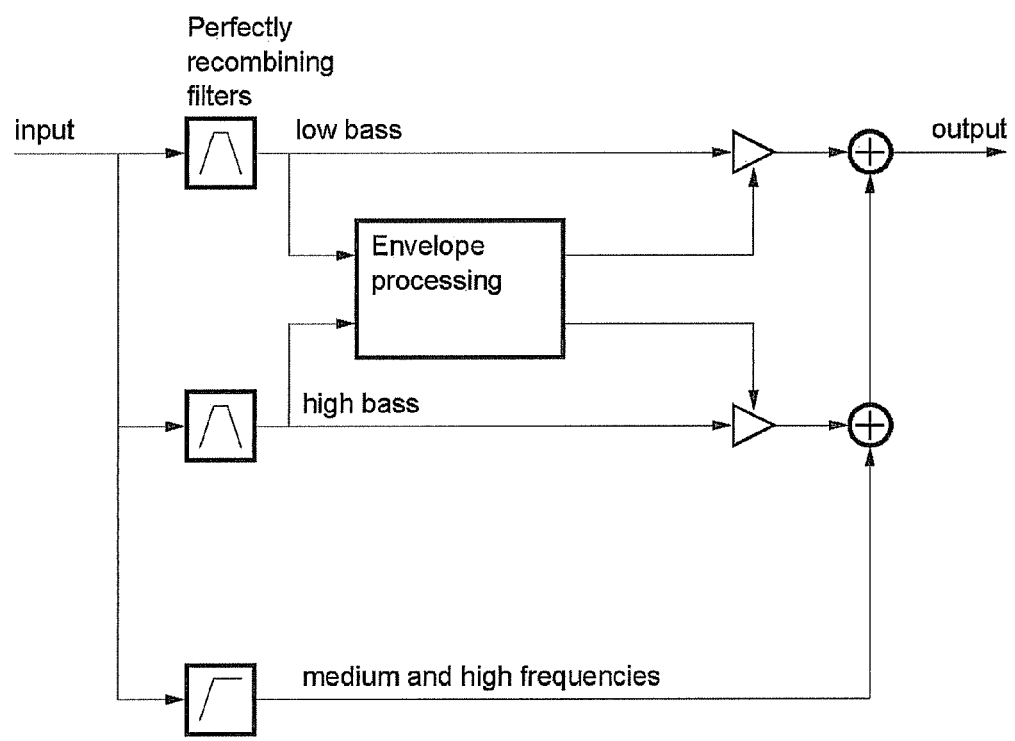
Figure 3:
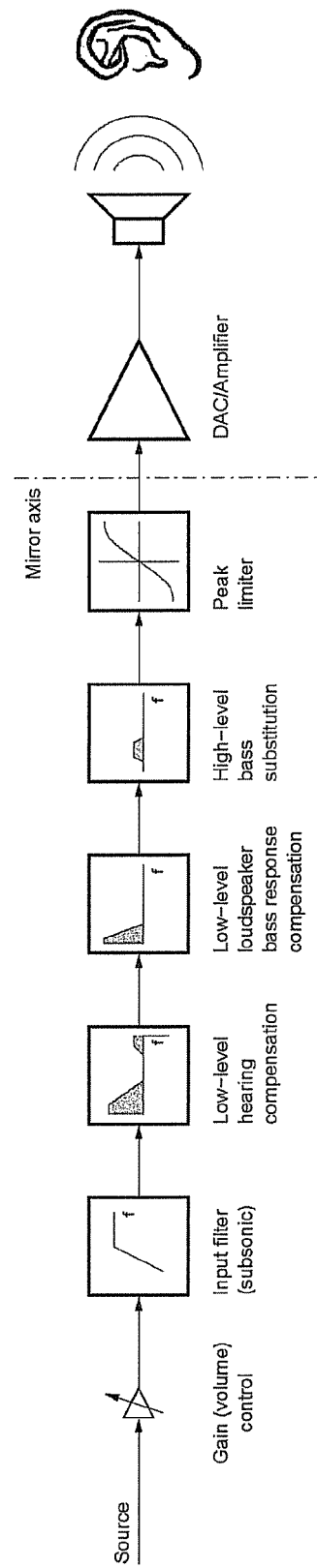
Figure 4:
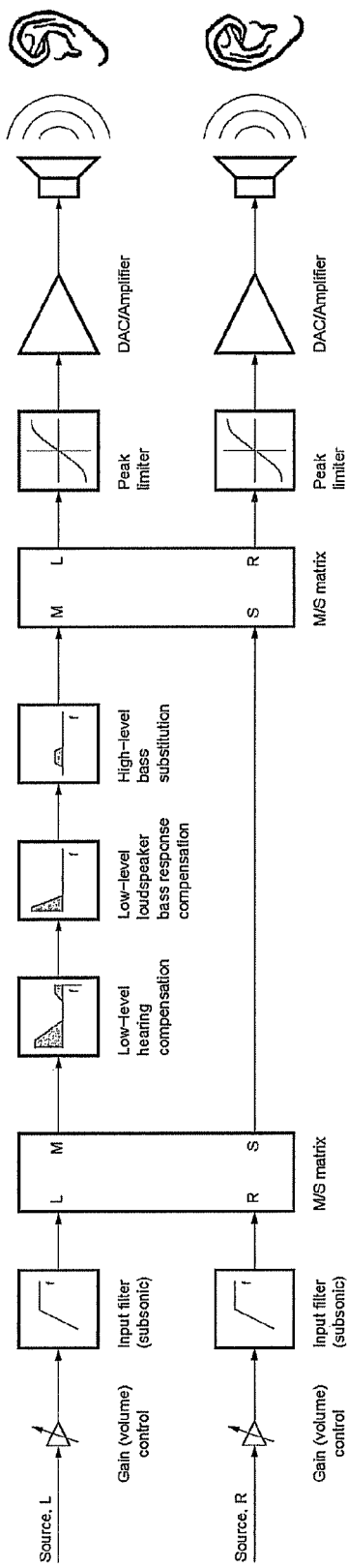
Figure 5:
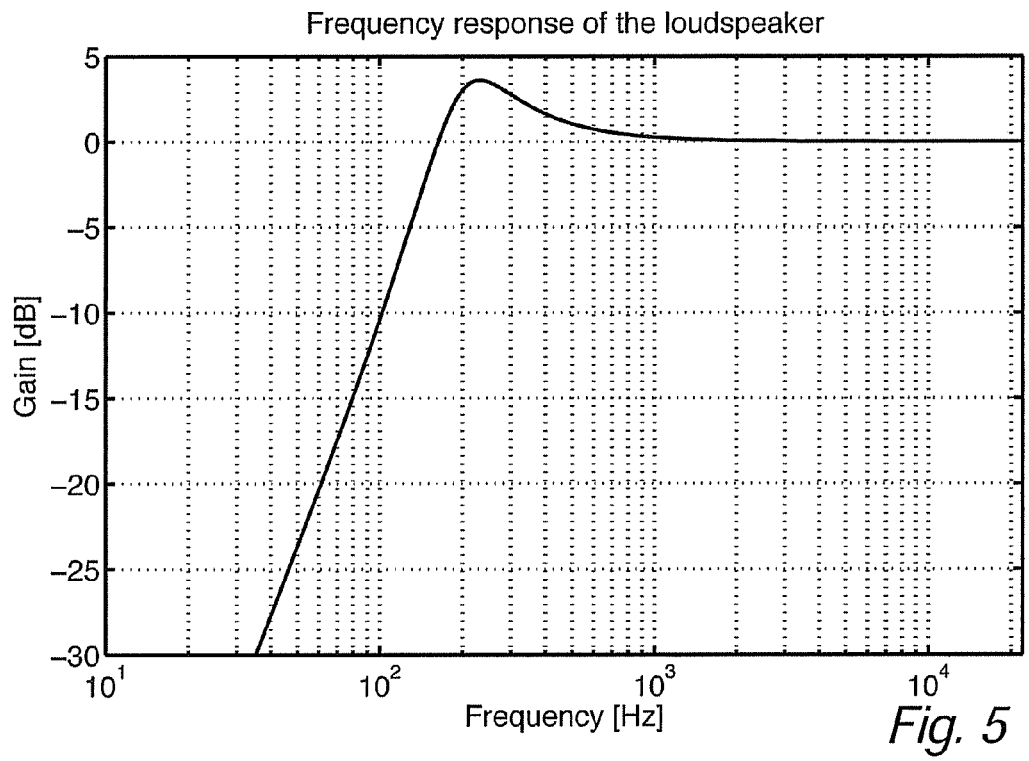

The invention will in the following be described with reference to the drawings where FIG. 1 illustrates so-called equal-loudness contours, FIG. 2 illustrates a bass enhancement system using the same principles of spectral processing as a multi-band vocoder, FIG. 3 illustrates an overall block diagram of a sound reproduction system with bass enhancement processing according to an embodiment of the present invention, FIG. 4 illustrates a stereo version of a bass enhancement system according to an embodiment of the present invention, FIG. 5 shows an example of a simplified bass frequency response of a typical small loudspeaker.

Figure 6:
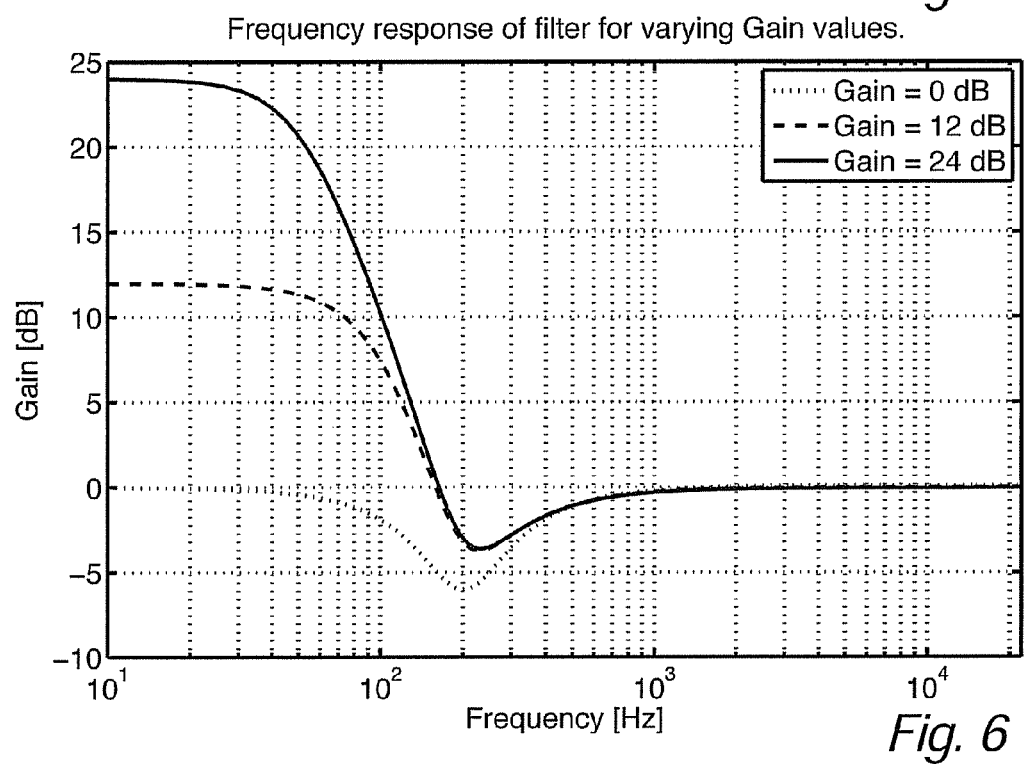
Figure 7:
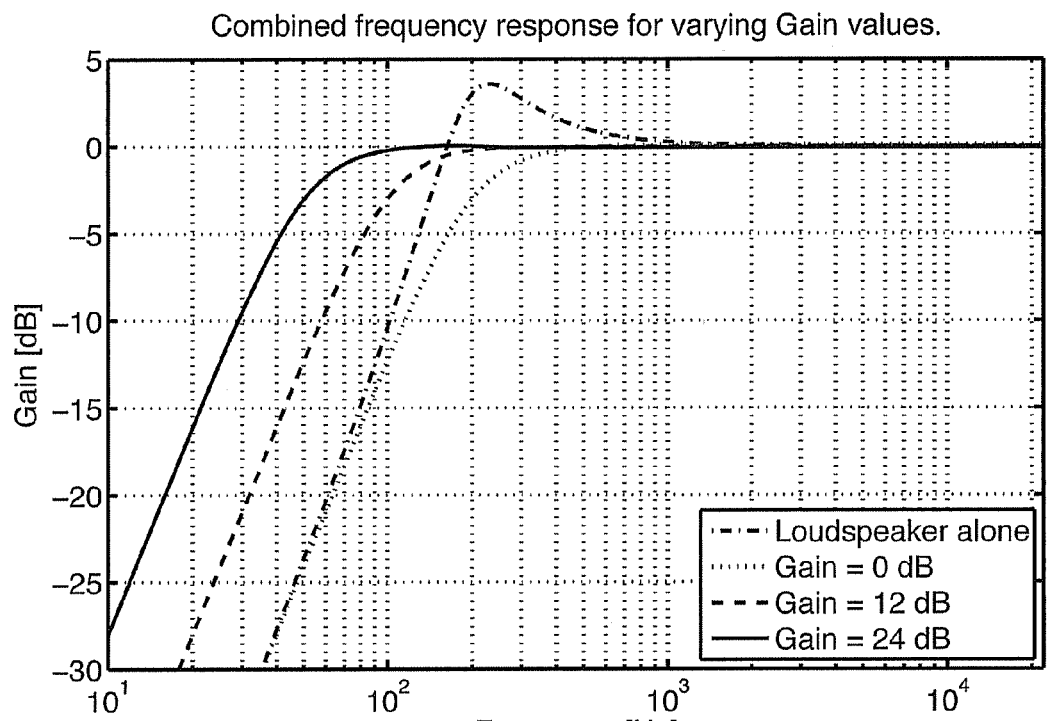
Figure 8:
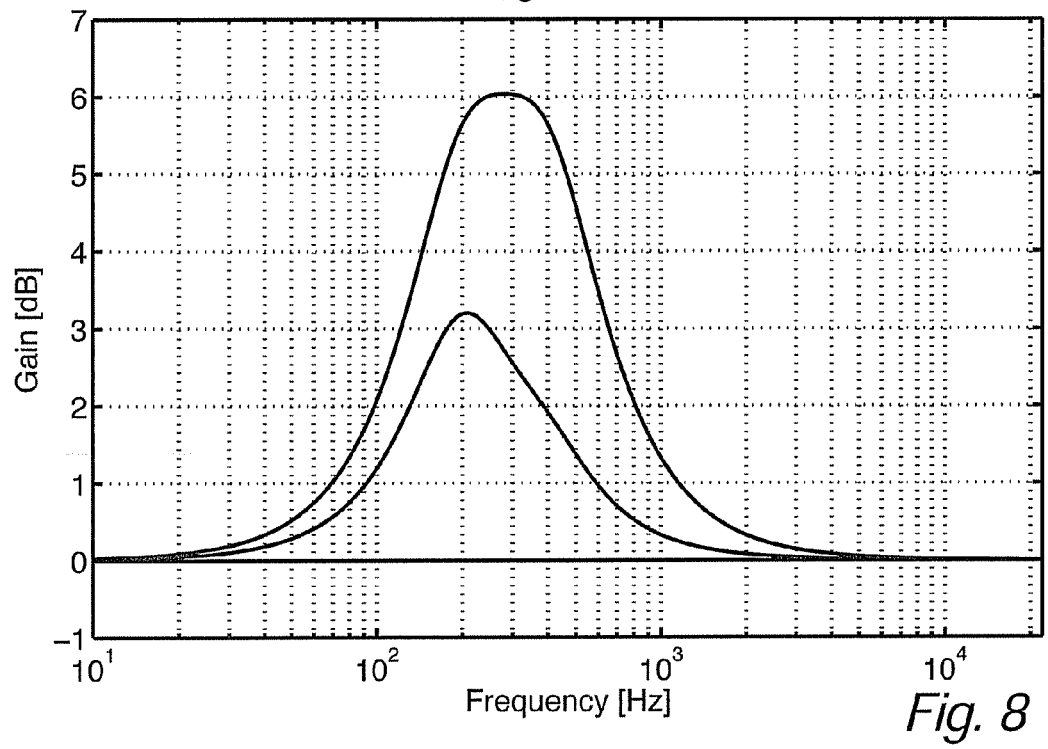

FIG. 6 shows an example of the frequency response of the loudspeaker compensation filter at three different gain settings, FIG. 7 shows an example of the combined frequency response of the loudspeaker itself and the loudspeaker compensation filter, at three different gain settings, and FIG. 8 shows an example of the frequency response of the substitution filter for different gain settings.

DETAILED DESCRIPTION

Audio frequencies below approximately 300 Hz are called the bass. There are several aspects of these low frequencies which cause challenges, especially for small and medium-sized reproduction systems.

A large amount of the total power of a music signal lies in the bass range. This is especially true for electrically generated and/or amplified music with instruments like the electric bass guitars, kick drums and synthesizers, but also for large church organs. Movie productions may also contain a significant amount of low frequency energy for various effects.

The ear is relatively insensitive to bass, especially at low levels. At high levels the ear is approximately equally sensitive to all frequencies, however. This means that there is less physical dynamic range in the bass (compared to medium and high frequencies) for full perceptual dynamic range.

Perception of pitch is well understood: See e.g. Eberhard Zwicker and Hugo Fastl, "*Psychoacoustics—Facts and Models*", $2^{nd}$ Edition, Springer-Verlag 1999, chapter 11, and Brian C J Moore, "*An Introduction to the Psychology of Hearing*", $3^{rd}$ Edition, Academic Press 1989, chapter 5, and Arthur H. Benade, "*Fundamentals of Musical Acoustics*", $2^{nd}$ Edition, Dover 1990, chapter 5, and Thomas D. Rossing, "*The Science of Sound*", $2^{nd}$ Edition, Addison-Wesley 1990, chapter 7, all of which are hereby incorporated by reference. A phenomenon called virtual pitch can be used to give a perception of a low-pitched signal, even without the fundamental frequency corresponding to the low pitch being present in the signal. This knowledge may be used to enhance the perceived level of low frequencies while keeping the physical levels moderate.

An aspect of bass which may be hard to reproduce without the proper physical capabilities of the loudspeaker system is the physical impact—or punch. It needs large movements of air and often lacks with headphone reproduction. The "disco" punch lies in the frequency range from 80 to 130 Hz.

When listening through small loudspeakers, the bass lacks in strength and quality due to physical and electrical constraints. Often it is possible to reproduce low (bass) frequencies satisfactory at a low level, but not at higher levels, however.

Some problematic aspects of bass reproduction comprise:

Level: Below the resonance frequency of the loudspeaker system the output level decreases. For a closed box: −12 dB per octave below the system resonance frequency. For a vented box (bass reflex): −24 dB per octave. The actual slopes just below the resonance frequency will differ from these numbers depending on the acoustic and electrical damping etc.

Distortion: Due to large movements of the loudspeaker diaphragm (excursion), and to limitations of the amplifier.

Excursion of the loudspeaker diaphragm: The suspension becomes increasingly non-linear at larger excursions.

Power consumption: A lot of the energy lies at low frequencies, even in the unprocessed signal.

Reduced sensitivity of the human hearing system to low frequencies at low levels.

By employing a suitable filter the frequency response of the loudspeaker can be equalised, at least at low playback levels.

At first glance, this is not unlike the "loudness" button/effect in many Hi-Fi amplifiers which is basically a bass enhancement filter that changes characteristics as a function of the position of the volume knob. The detailed filter characteristics for a loudspeaker correction filter is different to that of the "loudness" button, however, in that the loudspeaker filter should operate at a lower frequency range and targeted at the specific loudspeaker characteristics. A filter which amplifies low frequencies tends to increase the inherent problems in small loudspeakers.

Enhancing the bass level from small loudspeakers is a quite challenging task if a realistic sound level is wanted. The present invention involves a solution which does this. Furthermore, it may be advantageous to combine bass enhancement with other algorithms, especially dynamics processing.

Some Basics of the Hearing System

The ear's sensitivity at different frequencies can be described by the so-called equal-loudness contours, which are reported in Harvey Fletcher, "*Speech and Hearing in Communication*", Acoustical Society of America 1995 (1953 ed. reprint), chapter 11, hereby incorporated by reference. The equal-loudness contours are also standardised by ISO. They are illustrated in FIG. 1. The curves describe the physical intensity, in terms of sound pressure level SPL, that a pure tone at different frequencies should have to be of the same perceived loudness, measured in phons, as a pure tone at 1 kHz.

A consequence of the varying sensitivity of the hearing to different frequencies at different levels is that when playing back sound at a lower sound pressure level than it was originally intended for, the perceived timbre is changed. More specifically, this means that in particular the bass frequencies are perceived to be relatively weaker than when the sound is played back at a louder level. This property of the human hearing system has been known for several decades.

Although the shape of curves themselves may be interesting, the most important information to be read from them in the context of the present invention is the change of sensitivity (as a function of frequency) when the level changes. There seems to be some controversy about the exact shape of the equal loudness contours, but the distance between them is fairly undisputed.

TABLE 1

| Frequency | 40 phons | 60 phons | 80 phons | diff. 60, 40 | diff. 80, 60 | diff. 80, 40 |
|---|---|---|---|---|---|---|
| 25 Hz | 85.0 | 96.0 | 109.0 | 11.0 dB | 13.0 dB | 24.0 dB |
| 50 Hz | 65.0 | 78.0 | 93.5 | 13.0 dB | 15.5 dB | 28.5 dB |
| 100 Hz | 51.0 | 67.5 | 84.0 | 16.5 dB | 16.5 dB | 33.0 dB |
| 200 Hz | 42.0 | 60.0 | 78.0 | 18.0 dB | 18.0 dB | 36.0 dB |
| 400 Hz | 37.0 | 56.0 | 75.5 | 19.0 dB | 19.5 dB | 38.5 dB |

Table 1 shows a few values (sound pressure level SPL, measured in dB) read from the curves in FIG. 1. Differences of the SPL values between the 40, 60 and 80 phons curves are calculated and listed also, in the three rightmost columns. If sound reproduction at 80 phons is taken as a reference level for music reproduction, the differences in sensitivity for reproduction at 60 and 40 phons can be calculated. In a linear world these differences would be expected to be the same in dB as in phons. Obviously they are not. This is because a compression effect takes place in the hearing system.

A corrective filter can be applied, with a frequency-dependent gain of 20−x dB (or 40−x dB), where x is taken from the "diff 60, 40", "diff 80, 60" and "diff 80, 40" columns, and bearing in mind that the difference by definition is 20 dB at 1 kHz. The desired correction gain of the filter is shown in table 2:

TABLE 2

| Frequency | 40 phons (60) | 60 phons (80) | 40 phons (80) |
|---|---|---|---|
| 25 Hz | 9.0 dB | 7.0 dB | 16.0 dB |
| 50 Hz | 7.0 dB | 4.5 dB | 11.5 dB |
| 100 Hz | 3.5 dB | 3.5 dB | 7.0 dB |
| 200 Hz | 2.0 dB | 2.0 dB | 4.0 dB |
| 400 Hz | 1.0 dB | 0.5 dB | 1.5 dB |

The proposed filter may be fixed, i.e. independent on the input signal and gain (volume) setting of the sound reproduction system. In that case, some compromise setting must be selected. Alternatively, it may be variable in one of two ways: The filter characteristics can depend on the gain (volume) setting, as a kind of tone control—or the filter may be dynamic such that the filter characteristics changes as a function of properties of the input signal. The effect of such a dynamic filter is a frequency-dependent low-level compression.

Bass Enhancement at Low Levels

Typical electro-dynamic loudspeakers can play signals of quite low frequency—but not necessarily at high levels. The first step should therefore be to apply an appropriate low frequency equalisation at low levels. Within the scope of the description of the present invention, the term "low level" is used for levels, where those level-dependent corrective filters which exhibit high gain at low input levels, are at or near their maximum gain.

At higher levels it is not advisable to boost low frequencies due to mechanical (and electrical) limitations. It may actually be necessary to high pass filter the signal to the loudspeaker in order to protect the loudspeaker against over-excursion and to reduce intermodulation distortion.

Actually it may be beneficial to boost low frequencies at low levels more than needed to equalise the magnitude response of the loudspeaker, but for a different reason: The reduced sensitivity of the ear to low frequencies at low levels. This phenomenon is described in a simple way by the so-called equal loudness contours, see the above description regarding FIG. 1 and e.g. Harvey Fletcher, "*Speech and Hear-*

*ing in Communication*", Acoustical Society of America 1995 (1953 ed. reprint). In natural hearing these contours also apply, so it is only in situations where the reproduction level is below the natural level that any correction needs to be made. Most speech material is reproduced at near the natural level and does not need any correction. Music, on the contrary, is typically reproduced at a level somewhat below its intended level. This is not a new observation: Many old amplifiers and radios were equipped with a switch for selecting (bass) equalisation for either speech or music.

Also when listening under conditions where disturbance of the surroundings is to be minimised (such as during night time), the reproduced level is below the natural level. So the second step is to correct for the ears' reduced low frequency sensitivity at low levels.

Equalisation which depends on level is well known. This results in equalisation curves which change shape depending on the input level when measured for instance with a slow sine wave sweep.

Bass Enhancement at Medium Levels

The filters used to compensate for the frequency response of the loudspeaker and for the sensitivity of the hearing system reduce their gains at medium levels compared to the response at low levels. At medium levels the substitution filter not is active yet.

Bass Enhancement at High Levels

Protection of loudspeaker and amplifier is needed at high signal levels. But as the techniques mentioned in the previous section are not suitable for high levels due to the physical limitations, alternative bass enhancement methods must be considered.

An interesting property of the human hearing system is that the perception of pitch depends both of the fundamental frequency and of the frequency distance between the partials—the basis for the virtual pitch phenomenon. At least two methods exist to increase the perceived level of low-pitched signals:

Generating harmonics of the low frequency fundamental frequency, as in Waves' MaxxBass, see U.S. Pat. No. 5,930,373, hereby incorporated by reference, and Philips' Ultra Bass, see U.S. Pat. No. 6,134,330, hereby incorporated by reference. These methods rely on a non-linear transfer function to generate the harmonics, but this also causes unwanted intermodulation to be generated.

Enhancing harmonics already present in the signal, as in SRS Labs' TruBass, see U.S. Pat. No. 6,285,767, hereby incorporated by reference. This technique borrows its basic principle from the multiband vocoder, known since 1939, described in Homer W. Dudley's U.S. Pat. No. 2,151,091, hereby incorporated by reference.

As most practical audio signals consist of a set of partials, it could be expected that enhancing harmonics already present in the signal would be preferable over generation of harmonics. The fact that many musical instruments generate partials which are not exact integer multiples of the fundamental supports this expectation.

An aspect of bass, which can probably not be recreated when the physical circumstances are insufficient, is the bodily impact. This feeling happens at high levels and by large movements of air. Alternatively, the physical impact may be caused directly by vibrations (as known from seat shakers etc.).

Signal Processing Elements

The bass enhancement system comprises one or more of the signal processing elements described in the following.

Basic loudspeaker equalisation: At low and medium levels, the loudspeaker can deliver undistorted bass output by the definition of low and medium level used herein.

Low-level compensation for properties of the hearing system using equal loudness contours: Music and movies are often played below their intended level whereas speech is in general played at more natural levels. This way of level setting is motivated partly by listening comfort and partly by a desire for intelligibility.

A simple level-dependent corrective filter was described above and in table 2. This filter has a maximum steepness of 4.5 dB per octave and can thus be realised with a first order section. There is no need to equalise below 20 Hz, and maybe the lower limit should rather be around 40 Hz.

The low-level hearing compensation block also compensates for the presence of low-frequency noise in the surroundings, which are particularly disturbing when listening at low levels.

If the reproduction system is incapable of reproducing deep bass components, these can be approximated by means of substitution. One method to do this is a simple vocoder: Enhancing harmonics already present in the signal can be done in a straight-forward way using techniques of the multiband vocoder described as early as 1939 in Homer W. Dudley's U.S. Pat. No. 2,151,091, hereby incorporated by reference. The multiband vocoder consists of an analysis part and a synthesis part. The analysis part consists of a set of band-pass filters followed by envelope detectors. The synthesis part consists of a similar set of band-pass filters with gain controls. In a simple transmission application, the envelopes of each analysis band control the gains of the corresponding synthesis bands.

In order to enhance harmonics of the low bass signals, the envelopes of one or more low bass bands control the gains of one or more high bass bands. When filtering away the low bass, either by the loudspeaker driver itself or by some protective filter, the remaining part of the bass frequency spectrum should have the same loudness as the input signal. The perceived pitch is preserved due to the principle of virtual pitch.

This way of cross-coupling a vocoder has been known for a long time, although for other purposes than bass enhancement. It can be used for shifting the formants of speech thereby giving the impression of a smaller or larger set of speech organs. Or it can be used for scrambling (encrypting) speech by reordering the envelope signals. A more recent patent from 1979 on vocoder technology is U.S. Pat. No. 4,158,751, hereby incorporated by reference, where cross connections between envelope outputs and gain inputs are anticipated.

The SRS patent on bass enhancement mentioned above uses as one element the vocoder technique also described above.

A vocoder used for bass enhancement: A very simple vocoder consisting of just two bands in the bass and one band for the rest of the frequency spectrum is shown in FIG. 2.

This vocoder extracts the envelopes of the low and high bass signals, and controls the gain of the high bass signal in such a way that the (perceived) loudness of the high bass signal is equal to that of the original low and high bass signals together. The gain of the low bass could be adjusted dynamically in order to avoid the risk of overload—or the gain of the low bass could maybe even be zero.

A disadvantage of the SRS method, as described in U.S. Pat. No. 6,285,767, is that the phases are not under control, due to a lack of a proper band split filter. Weak and strong signals are therefore somewhat out of phase.

Combined Processing

In the previous sections, a number of problems relating to sound reproduction have been treated separately in order to ease understanding of the problems and means to solve them. It turns out, however, that an advantageous embodiment of the present invention solves the problems using several, closely coupled, processing elements, as described below:

The goal is to provide an auditory impression which, under the constraints given, corresponds as closely as possible to the source signal when played back under ideal circumstances. The proposed processing is basically sequential with elements placed according to a mirror principle, see FIG. 3, an overall block diagram of a sound reproduction system with bass enhancement processing according to an embodiment of the present invention.

At the very beginning of the processing chain the original source signal is input. Modifications to the signal, which relate closely to properties of the end of the chain, the hearing system, should therefore be placed near the source signal. The two elements in the present block diagram which are related directly to the hearing systems are the overall gain control (commonly called the volume control), and the low-level hearing compensation.

Limitations of the processing and reproduction chain should be mirrored in a similar way. The maximum allowed voltage fed to the power amplifier should be limited at the output of the processing chain, so the mirror axis is placed just at the interface between processing and amplifier, at least in the proposed block diagram.

In-between these two parts are those which relate to limitations of the loudspeaker, including its enclosure and physical arrangement. Two elements handle the loudspeaker limitations: The first and most important is the compensation for the reduced gain of the loudspeaker at low frequencies. As this compensation implies a filter with large gain at low frequencies, mechanical, thermal and electrical constraints of the loudspeaker and amplifier will apply at higher levels. The compensation is therefore gradually decreased at higher levels.

In order to maintain at least a part of the low frequency power (or loudness) the second element comes into action, substitution. The substitution element consists of a filter which gradually increases its gain at mid-bass frequencies as the gain of the loudspeaker compensation filter is reduced.

The frequency responses of the filters in the signal chain are just sketched as grey areas in FIG. 3 to indicate that the actual response will vary within these areas controlled by level-dependent elements commonly termed side chains. Side chains are used as real-time gain computing elements of dynamics compressors and expanders. Whereas in a compressor the actual gain changing element is just a multiplier, the gain changing element in the blocks just described is a filter with real-time controllable frequency response.

It is noted that the different processing blocks, most notably the hearing compensation, the loudspeaker bass response compensation and the bass substitution, even though illustrated at their preferred order in FIG. 3 may be ordered differently, or some of them left out or substituted for alternative blocks in other embodiments of the present invention.

The low-level hearing compensation block comprises a variable gain at low frequencies and at high frequencies, preferably designed so as to flatten the equal loudness contour for the current signal level. As this block is placed subsequent to the volume control the signal level in general corresponds to the level that is to be reproduced and the appropriate equal loudness contour to flatten can therefore be selected. This would not be immediately possible if the hearing compensation block were to operate on a full scale or normalised signal.

An alternative to measuring the intended playback level after the volume control is to measure the unprocessed input level and correcting the measurement with the setting of the volume control in order to set the filter appropriately, i.e. to flatten the equal loudness contour for the current signal level. This technique can also be applied to the low-level bass response compensation block and the high-level bass substitution block.

The low-level loudspeaker bass response compensation block comprises a variable gain at low frequencies, preferably designed to compensate for the frequency response of the loudspeaker, in particular for low frequencies. The gain controller may operate according to the actual profile of the connected loudspeaker, if known, or it may operate according to a simplified model, e.g. referring to one of a few archetypes of loudspeakers such as e.g. small, medium or large loudspeakers.

FIG. 5 shows an example of a simplified bass frequency response of a typical small loudspeaker. The resonance frequency is 200 Hz, and the effective Q-value of the pole pair resonance is a little higher than the ideal, which in many cases is 0.707, corresponding to the maximally flat Butterworth tuning. Loudspeakers with a frequency response exhibiting a peak as illustrated tend to sound "boomy" or "boxy", which is undesirable.

In a preferred embodiment of the invention the low-level loudspeaker compensation block is adapted to the measured or calculated frequency response of the loudspeaker, as shown in FIG. 5. FIG. 6 shows an example of the frequency response of the loudspeaker compensation filter at three different gain settings: 0, 12 and 24 dB. Notice that the frequency response exhibits a pronounced dip, caused by the zero pair, which compensates for the resonance peak, caused by a pole pair, in the loudspeaker response. Also notice that the zero pair frequency and Q value of the filter is kept constant to compensate for the corresponding frequency and Q value of the pole pair in the loudspeaker response. Furthermore notice that the pole pair frequency of the filter moves downwards with increasing gain.

FIG. 7 shows an example of the combined frequency response of the loudspeaker itself and the loudspeaker compensation filter, at three different gain settings: 0, 12 and 24 dB. Notice that the resulting frequency response for all of the three gain settings is maximally flat, corresponding to the desired Butterworth tuning.

The fact that the resulting frequency response of the combination of loudspeaker and loudspeaker compensation filter exhibits a maximally flat response regardless of the low frequency gain applied by the loudspeaker compensation filter is a particularly advantageous property of the present invention. As the low frequency gain applied by the loudspeaker compensation filter changes, just the low corner frequency of the combined frequency response changes.

The design of the loudspeaker compensation filter ensures that the bass reproduction at low levels extends to lower frequencies than in the unprocessed case. The deep bass played by the loudspeaker at low levels is true and physical, and does not rely on a less robust psycho-acoustic phenomenon such as virtual pitch. The timbre is therefore reproduced more accurately than in systems relying solely on the phenomenon of virtual pitch to give the impression of deep bass.

Two of these systems are U.S. Pat. No. 5,930,373 (Waves) and U.S. Pat. No. 6,134,330 (Philips) described earlier.

The maximally flat shape of the combined frequency response of loudspeaker and loudspeaker compensation filter for varying gain settings is an advantage when compared to the response in US2004/0022400 (Magrath).

The high-level bass substitution block, which as described above exploits the fact that the human hearing system may experience a deep bass component by only actually hearing some of its harmonics or partials, typically because the loudspeaker is simply incapable of reproducing the deep bass component itself, preferably comprises a variable gain, variable frequency band, band-gain filter, preferably designed so as to boost a frequency band of e.g. 100-300 Hz according to the level of signal content in a frequency band of e.g. 40 to 160 Hz. The gain should be variable so as to vary with the actual deep bass level as it should obviously only substitute actually occurring deep bass components. The frequency band should also be variable so as provide for a certain adaptation to the actual spectral location of the deep bass content, and in order to avoid a sense of "boomy" or "boxy" sound which would occur if the same frequency band were used at all gain settings. Compared to the method used in the old vocoder and in U.S. Pat. No. 6,285,767 (SRS) the changing centre frequency and possibly also bandwidth of the substitution filter in the present invention results in an output signal with a more natural timbre, i.e. less colouration.

An example of the frequency response of the substitution block for three different gain settings is shown in FIG. 8. As seen, the frequency of maximum gain, also called the centre frequency in this context, varies as a function of the gain control setting. Also the bandwidth varies as a function of gain control setting.

In a preferred embodiment of the invention as illustrated in FIG. 3, an input filter is provided for cutting away non-audible signal contents, e.g. below 40 Hz, in order to protect the amplifier and loudspeaker and rest of the system from high energy transferring and anyway non-audible content.

In a preferred embodiment of the invention as illustrated in FIG. 3, a peak limiter is further provided at the end of the chain for ensuring that no potentially destructive peaks are let through to the power stage and loudspeaker. Such peaks may be produced by the gain blocks, in particular if all gain blocks boost the same incoming peak.

Sound reproduction systems typically consist of two channels, for stereo, not just mono as implied in FIG. 3. Most of the low frequency energy in typical stereo source material (western music) is monophonic and identical in the left and right channels.

In many cases side chains can be common for two or more audio channels, and in that way a significant amount of processing can be saved with no or almost no loss of sound quality.

Due to the low frequencies and slow time constants involved in the dynamically changing filters, the side chains controlling them can run at a reduced sample rate—which saves processing power. Based on knowledge of the processing power needed for various elements it is apparent that the dominating factor in terms of processing power is the main signal path, the filters.

FIG. 4 illustrates a stereo version of the bass enhancement system according to the present invention. It takes advantage of one way to save filters, which is to exploit the mono-like property of the low frequency part of the source signal. According to this embodiment of the present invention this is done by using an M/S matrix, where the M (mid) part consists of the sum of the left (L) and right (R) input channels, and the S (side) part consists of the difference between left and right. For signal parts which are identical in left and right the S signal will be zero. Thus it is only necessary to process the M signal.

An M/S matrix should be placed at both input and output. As long as the processing within the M/S domain is identical for M and S the resulting left/right signal at the output M/S matrix is identical to the original L/R input (possibly with a constant gain factor applied). When processing just the M signal the resulting output of the processing will be identical in the left and right output channels. This may or may not be satisfactory.

For the very low frequencies which are amplified by the loudspeaker compensation filter the resulting monophonic bass signal is fully acceptable. This is also supported by the wide-spread use of sub-woofers which play a monophonic version of the very low frequency parts of the signal through just one loudspeaker. In most cases this does not deteriorate the spatial properties of the signal, except in some classical music with lots of low-frequency spatially wide reverberation—also known as envelopment.

The substitution filter will often emphasise frequencies where the input signal is not identical in the two channels. In that case the emphasised part of the spectrum will appear to be placed centrally instead of e.g. in just one of the channels. Such a crosstalk (lack of channel separation) may be undesirable.

One way to overcome the mid-bass (/low-mid) crosstalk without duplicating the filters is to detect circumstances where an undesirable crosstalk would occur and increase the channel separation accordingly.

The invention claimed is:

1. Method of performing a bass enhancement of an input audio signal, the input audio signal being intended for amplification and subsequent audio reproduction by a loud speaker,
    the input signal having low frequency audio components and thereto associated harmonics,
    wherein the bass enhancement of said input signal is obtained by filtering of said associated harmonics already present in the input signal,
    the filtering comprises obtaining said associated harmonics from the input signal and increasing a gain in a frequency range of said associated harmonics when a level of said low frequency audio components increases, and
    wherein a center frequency of said frequency range is increased when the level of said low frequency audio components increases.

2. The method according to claim 1, wherein the bandwidth of said frequency range is increased when the level of said low frequency audio components increases.

3. The method according to claim 1, wherein said increase of said gain of said filtering when said level of said low frequency audio components increase is controlled by an expander side chain.

4. The method according to claim 1, wherein said gain of said filtering is further based on a setting of a user gain control related to an intended playback level.

5. Method of performing a bass enhancement of an input audio signal, the input audio signal being intended for amplification and subsequent audio reproduction by a loud speaker,
    the input signal having low frequency audio components and thereto associated harmonics,
    wherein the bass enhancement of said input signal is obtained by filtering of said associated harmonics already present in the input signal, the filtering comprises obtaining said associated harmonics from the input signal and increasing a gain in a frequency range of said associated harmonics when a level of said low frequency audio components increases, wherein a bandwidth of said frequency range is increased when the level of said low frequency audio components increases; and wherein a center frequency of said frequency range is increased when the level of said low frequency audio components increases.

6. The method according to claim 5, wherein said increase of said gain of said filtering when said level of said low frequency audio components increase is controlled by an expander side chain.

7. The method according to claim 5, wherein said gain of said filtering is further based on a setting of a user gain control related to an intended playback level.

8. Method of performing a bass enhancement of an input audio signal, the audio input signal being intended for amplification and subsequent audio reproduction by a loudspeaker, the input signal having low frequency audio components and thereto associated harmonics, wherein the bass enhancement is performed according to a level of the input signal, comprising:

boosting said low frequency audio components where the input signal level is below a low level, and obtaining said associated harmonics from the input signal and boosting said associated harmonics where the input signal level is above a high level;

wherein said high level is above said low level.

9. The method according to claim 8, wherein said boosting said associated harmonics is performed over a frequency band, and wherein a center frequency of said frequency band increases when the level of said low frequency audio components increases.

10. The method according to claim 8, wherein said boosting said associated harmonics when said input signal level is above said high level is controlled by an expander side chain.

11. The method according to claim 8, wherein said boosting said low frequency audio components when said input signal level is below said low level is controlled by a compressor side chain.

12. The method according to claim 8, wherein said boosting is further based on a setting of a user gain control related to an intended playback level.

\* \* \* \* \*